United States Patent [19]

Fiory et al.

[11] Patent Number: 5,132,280
[45] Date of Patent: Jul. 21, 1992

[54] METHOD OF PRODUCING A SUPERCONDUCTIVE OXIDE LAYER ON A SUBSTRATE

[75] Inventors: Anthony T. Fiory, Summit; Michael Gurvitch, New Providence, both of N.J.

[73] Assignee: AT&T Bell Laboratories, Murray Hill, N.J.

[21] Appl. No.: 101,043

[22] Filed: Sep. 25, 1987

[51] Int. Cl.$^5$ .............................................. B05D 5/12
[52] U.S. Cl. ........................................ 505/1; 505/730; 505/731; 427/62; 427/63; 204/192.24
[58] Field of Search .................... 204/298, 192.24; 29/599; 427/63, 62

[56] References Cited

U.S. PATENT DOCUMENTS

| | | | |
|---|---|---|---|
| 4,316,785 | 2/1982 | Suzuki et al. | 427/62 |
| 4,389,295 | 6/1983 | Davey et al. | 204/192.26 |
| 4,410,407 | 10/1983 | Macaulay | 204/192.25 |
| 4,591,417 | 5/1986 | Kaiser et al. | 204/192.3 |
| 4,611,390 | 9/1986 | Tanaka et al. | 29/599 |
| 4,826,808 | 5/1989 | Yurek et al. | 505/1 |

OTHER PUBLICATIONS

Gruen et al., *J. Electrochem. Soc.*, Jun., 1987, pp. 1588-1589.
Evetts et al., *Ext. Abstracts-High Tc Superconductors,* (MRS-Proceedings Apr. 23-24 1987) pp. 227-229.
Bunshah et al., *Deposition Technologies for Films and Coatings* (Noyes, Park Ridge, NJ) c. 1982 p. 115.
Jin et al., "High Tc Superconductors-Composite Wire Fabrication" Appl. Phys. Lett 51(3) Jul. 1987 pp. 203-204.
Koch et al., "Thin Films and Squids made from YBa$_2$Cu$_3$O$_y$," Extended Abstracts Edited by Gubser et al. Apr. 1987 (Anaheim, CA) pp. 81-84.
"High Superconducting Transition Temperatures in Sputter-Deposited YBaCuO Thin Films," *Nature*, vol. 326, No. 30, Apr. 1987, pp. 857-859.
"Electrical Properties of Superconducting (La$_{1-x}$Sr$_x$)$_2$CuO$_4$ and Ba$_2$YCu$_3$O$_{7-\delta}$ Thin Films", NTT Electrical Communications Laboratories, Tokai, Ibaraki, Japan.
"Preparation of Superconducting YBa$_2$Cu$_3$O$_x$ Thin Films by Oxygen Annealing of Multilayer Metal Films", *Appl. Phys. Let.*, vol. 51, No. 11, Sep. 1987, pp. 858-860.
"Thin Films and Squids Made from YBa$_2$Cu$_3$O$_y$", IBM Thomas J. Watson Research Center, Yorktown Heights; NY, pp. 81-84.
"Superconducting Thin Films of the Perovskite Superconductors by Electron-Beam Deposition", Stanford University, Dept. of Applied Physics, Stanford, CA, pp. 169-171.
"Critical-Current Measurment in Epitaxial Films of YBa$_2$Cu$_3$O$_{7-x}$ Compound", *Phys. Rev. Let.*, vol. 58, No. 25, Jun. 1987, pp. 2684-2686.
"Bulk Superconductivity at 91K in Single-Phase Oxygen-Deficient Perovskite Ba$_2$YCu$_3$O$_{9-\delta}$", *Phys. Rev. Let.*, vol. 58, No. 16, Apr. 1987, pp. 1676-1679.
"New Superconducting Cuprate Perovskites", *Phys. Rev. Let.*, vol. 58, No. 18, May 1987, pp. 1888-1890.
"Superconductivity at 155K" *Phys. Rev. Let.*, vol. 58, No. 24, Jun. 1987, pp. 2579-2581.

*Primary Examiner*—Sam Silverberg
*Attorney, Agent, or Firm*—E. E. Pacher

[57] ABSTRACT

A method of forming a superconductive metal oxide film on a substrate is disclosed. The method comprises depositing a metal layer on the substrate and heat treating the metal layer in an oxygen-containing atmosphere such that the oxide film is formed therefrom. The metal layer is deposited such that it is substantially free of reactive constituents, e.g., oxygen and/or fluorine, and such that it contains all the metal constitutents that are to be contained in the oxide film. Advantageously, the metal layer is deposited such that the various metal constituents (e.g., Y, Ba, and Cu) are substantially mixed. The inventive method simplifies deposition control since the densities of the metal deposits are well known and constant, and permits relatively rapid deposition (e.g., by DC sputtering) since the targets are not subject to oxidation. A multi-stage heat treatment process, with patterning of the oxide layer carried out at an intermediate stage of the process, that can result in improved pattern definition and can avoid deterioration of the oxide film as a consequence of the patterning, is also disclosed.

2 Claims, 1 Drawing Sheet

METHOD OF PRODUCING A SUPERCONDUCTIVE OXIDE LAYER ON A SUBSTRATE

FIELD OF THE INVENTION

This invention pertains to methods for producing a superconductive metal oxide film on a substrate.

BACKGROUND OF THE INVENTION

The recent discovery of superconductivity in a (La, Ba) cuprate led to worldwide research activity which very quickly resulted in the discovery of other metal oxides having relatively high superconductive transition temperature $T_c$. In particular, it was discovered that $YBa_2Cu_3O_7$ can have $T_c$ of about 90 K. [See, for instance, R. J. Cava et al, *Physical Review Letters*, 58, 1676 (1987).]

To date, the research efforts have resulted in the identification of two classes of high $T_c$ oxide superconductors. The first class has nominal composition $La_{2-x}M_xCuO_{4-\epsilon}$, where M denotes one or more divalent metals such as Ba, Sr, or Ca. The members of this first class have been found to have transition temperatures ranging up to about 40 K.

The second class of metal oxide superconductors has nominal composition $Ba_{2-y}(M_{1-x}M'_x)_{1+y}Cu_3O_{9-\delta}$, where M and M' are chosen from Y, Eu, Nd, Sm, Gd, Dy, Ho, Er, Tm, Yb, Lu, La, Sc, Sr or combinations thereof. Typically, $0 \leq x \leq 1$, $0 \leq y \leq 1$, and $1 < \delta < 3$. See, for instance, D. W. Murphy et al, *Physical Review Letters*, 58(18), 1888 (1987). Herein, the former class of compounds will be referred to as the La-cuprate system, and the latter as the Ba-cuprate system. Many members of the Ba-cuprate system have $T_c$ greater than 77 K., the boiling point of liquid nitrogen.

Exemplary of the Ba-cuprate system are $YBa_2Cu_3O_7$, $EuBa_2Cu_3O_7$, and $La_{1.5}Ba_{1.5}Cu_3O_7$. (It will be understood that chemical formulae of oxide superconductors herein are approximate only, and that deviations may occur. For instance, the optimal oxygen content in $YBa_2Cu_3O_7$ frequently is not 7 but about 6.9).

Recently, there have been reports that incorporation of fluorine into at least one composition in the Ba-cuprate system can yield a superconductive material with relatively high transition temperature. [S. R. Ovshinsky et al, *Physical Review Letter*, 58 2579 (1987).]

A multitude of applications for the novel high $T_c$ oxide superconductors have been proposed, and many of the proposed applications require the formation of a thin film (e.g., less than about 5 $\mu$m thickness) of the superconductive material on a substrate. Exemplary of such applications are superconductive interconnects between electronic devices, chips, or assemblies, and superconductive components such as Josephson junctions and SQUIDs.

Superconductive oxide films have been produced by a variety of techniques, including evaporation or sputtering in a reactive (e.g., oxygen-containing) atmosphere, sputtering from oxide targets, and spin-on of a metal-containing solution. See, for instance, R .H. Koch et al, Extended Abstracts-High Temperature Superconductors, *Proceedings of Symposium S*, 1987 Spring Meeting of the Materials Research Society, Apr. 23, 1987, Anaheim, Calif. (Materials Research Society, Pittsburg, PA, 1987), page 81; R. H. Hammond et al, *Proceedings of Symposium S*, supra, page 169; P. Chaudhari et al, *Physical Review Letters*, 58, 2684 (1987), (evaporation of yttrium, barium, and copper in an oxygen atmosphere, followed by annealing of the resulting oxygen-containing film at temperatures in the range of 850° C. to 910° C.). See also R. E. Somekh et al, *Nature*, 326, page 857 (1987), (sputtering from Cu, BaO and $Y_2O_3$ sources onto a sapphire substrate held at 1050° C. followed by an anneal in oxygen at 500° C.). M. Moriwaki et al, in *Proceedings of Symposium S*, supra, page 85, described production of films by sputtering, but details of the process were not given. The spin-on technique is disclosed in U.S. patent application Ser. No. 037,264, "Method for Producing a Superconductive Oxide Layer, and Apparatus Comprising Such a Layer", filed Apr. 10, 1987 for C. E. Rice. A further deposition technique (using multiple sources including a source comprising a fluoride of a Group IIA element) is disclosed in U.S. patent application Ser. No. 089,296, "Robust Superconductors", filed Aug. 25, 1987 for R. E. Howard et al.

Although all of the above techniques have been successfully employed to produce superconductive oxide films, the prior art techniques typically do have certain shortcomings. For instance, the reactive sputtering technique is relatively slow, and typically poses difficult control problems due to the uncertainties associated with the density of as-deposited material, which typically has unknown oxygen content. Sputtering from an oxide target is also difficult to control due, inter alia, to the fact that the target surface typically becomes progressively depleted in, e.g., Ba. On the other hand, it is frequently difficult to produce oxide films of a thickness in excess of about 1 $\mu$m by the spin-on technique. Furthermore, at least some prior art techniques for patterning superconductive oxide films frequently result in a deterioration of the superconductive properties of the films.

In view of the potential technological importance of superconductive oxide films, a method for forming such films that is easily controllable and relatively rapid and which can be used to form relatively smooth films, including relatively thick films, would be highly desirable. This application discloses such a method. Disclosed is also a method for patterning metal oxide films that typically does not result in deterioration of the superconductive properties of the films.

SUMMARY OF THE INVENTION

The inventive method of making a structure including a superconductive metal oxide film comprises providing an appropriate substrate, depositing a metal layer that is substantially oxygen-free (as well as free of other reactive constituents such as fluorine) on the substrate, followed by heating at least a portion of the metal layer in an oxygen-containing atmosphere for a time sufficient to result in formation of the superconductive metal oxide film from the metal layer. The technique not only can be advantageously employed to produce La-cuprate and/or Ba-cuprate superconductive films but also may have utility in the production of other high $T_c$ metal oxide film, should such materials be discovered.

The substrate is chosen such that poisoning of the oxide film is substantially avoided. By "poisoning" we mean herein an interaction between the substrate and the film thereon that results in a substantial deterioration of the superconductive properties of the film (e.g., deterioration of the transition temperature $T_c$, transition width, critical current, etc.).

The overall composition of the deposited metal layer substantially corresponds to that of the metal constituents of the oxide film to be formed therefrom, i.e., the metal elements (M, M', M", ...) are to be present in the metal layer in substantially the same ratio (x:x':x": ...) as they are to be present in the oxide film [of composition $(M_x M'_{x'} M''_{x''} \ldots) O_y R_{y'}$]. Herein, R is a possible optional reactive element, e.g., fluorine, to be introduced into the layer subsequent to the metal deposition.

Desirably, the metal layers are deposited such that the constituents of the layer are substantially intimately mixed, since such a well-mixed (i.e., substantially homogeneous) layer can be oxidized to yield a relatively smooth superconductive film, whereas relatively inhomogeneous metal layers tend to yield relatively rough superconductive films.

In currently preferred embodiments, the heat treatment comprises a first firing, with the firing conditions (including temperature and duration) chosen such that a relatively smooth and fine-grained oxide film results, with a subsequent second firing, with the firing conditions (including temperature, duration, and cool-down conditions) chosen such that an oxide film having the desired superconductive properties results. The firing at the second temperature typically results in grain growth in the film. The second firing temperature frequently is (but need not be) higher than the first.

In many cases, the superconductive film is a patterned film. In a currently preferred embodiment of the invention, the film is patterned subsequent to the first firing but prior to the second firing, whereby relatively high pattern definition can be attained, and whereby deterioration of the superconductive properties of the oxide film (which frequently is attendant upon patterning subsequent to completion of heat treating the film) is substantially avoided.

The above two-stage heat treatment, with patterning between the first and second firings, is expected to be advantageously useable also with prior art film deposition methods, e.g., deposition in a reactive atmosphere.

DETAILED DESCRIPTION OF SOME PREFERRED EMBODIMENTS

Figure 1:
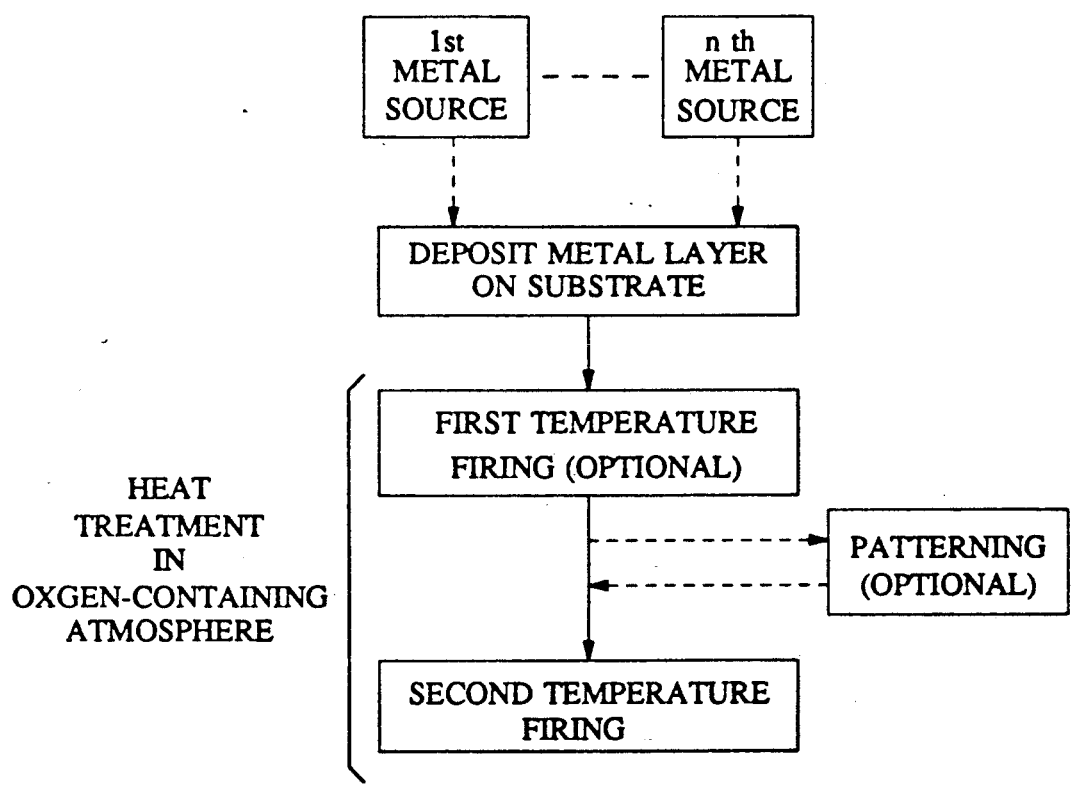
FIG. 1 outlines, in block diagram form, an exemplary embodiment of the inventive process.

The remainder of the discussion herein will be primarily in terms of a particular Ba-cuprate, of nominal composition $YBa_2Cu_3O_7$, without thereby implying any limitation on the applicability of the inventive method. FIG. 1 schematically depicts an exemplary embodiment of the inventive process.

Superconductive oxide films according to the invention, can be formed on a variety of substrates (e.g., single crystal yttria-stabilized zirconia) including compound substrates comprising a first material such as sapphire, cubic zirconia, MgO, $SrTiO_3$, $Ba_{0.075}Sr_{0.925}TiO_{0.3}$, or silicon, with a second material layer (generally to be referred to as the buffer layer) thereon. The buffer layer serves to prevent or at least reduce interaction between the first material and the superconductive oxide layer thereon. Exemplary buffer layers comprise Ag and/or Nb. We have also found that a previously reacted (sacrificial) superconductive oxide layer can advantageously serve as a buffer layer.

As indicated, buffer layers need not necessarily comprise a single material only, and in some cases, it is desirable to use a compound buffer layer such as described for instance in co-assigned U.S. patent application, Ser. No. 094,573, titled "Semiconductor Devices Having Superconducting Interconnects", filed Sep. 9, 1987, for M. Gurvitch and R. Levy, and incorporated herein by reference. Among the substrate/superconductor interactions of concern herein are diffusion of substrate material into the superconductor, diffusion of one or more constituents of the superconductor into the substrate, and chemical reaction between substrate and superconductor constituents.

The minimum thickness of the buffer layer frequently will be a function of the composition of the underlying substrate material and/or of the superconductive oxide thereon. For instance, we have found that 30 nm of Nb or Ag on $ZrO_2$ or MgO can serve to essentially eliminate poisoning of a $YBa_2Cu_3O_7$ film thereon.

After provisin of an appropriate substrate, the next significant step in the inventive method is deposition of a substantially oxygen-free (also free of other reactive constituents such as fluorine, but not necessarily free of inert constituents such as argon) metal film on the substrate with the various metals being present in the layer in the same ration as they are to be present in the superconductive oxide film to be formed therefrom. For instance, if the superconductive oxide film is to have the composition $YBa_2Cu_3O_7$, then Y, Ba, and Cu are to be present in the atomic ratio of essentially 1:2:3, respectively. The as-deposited metal layer need not necessarily be completely homogeneous but can, for instance, be composed of a multiplicity of layers or strata, with each stratum consisting substantially of only one element. Advantageously, the layers in such a layered structure are relatively thin (less than about 10 nm), such that essentially complete homogeneity can quickly be achieved during heat treatment. Use of a relatively thick (e.g., more than about 10 nm) layers frequently leads to segregation, and consequently to films having relatively poor superconductive properties and morphology.

The substantially oxygen-free metal layer can be produced by any appropriate technique, e.g., by sputtering or evaporation. The method currently preferred by us is magnetron sputtering in an inert atmosphere, e.g., an argon atmosphere. Deposition can be from individual metal sources, e.g., using three magnetron sources using separate Y, Ba, and Cu targets or, at least in principle, from a single alloy source. Of course, intermediate cases are also possible. For instance, we have found it advantageous to deposit metal films using two magnetron sources, one comprising a Y target, the other one comprising a $Ba_2Cu_3$ alloy target, since the alloy, being less prone to oxidation and hydration than a pure Ba target, allows for more efficient pre-sputter target cleaning.

A significant advantage of the inventive method is the ease and accuracy with which the deposition of the metal layer can be controlled. This is due, at least in part, to the fact that the densities of the metal deposits are well known and constant during the deposition time, whereas the densities of prior art oxygen-containing deposits typically are not well known and may not be constant during the course of the deposition. The inventive technique thus makes possible the use of standard programmable deposition monitors and can result in better control of the composition of the deposit, and therefore of the resulting oxide film. Furthermore, deposition rates in the inventive method can be easily and reliably controlled and can be varied over a relatively wide range, due to the fact that the source material(s) is (are) not subject to oxidation during deposition.

We have typically found it to be desirable to protect the as-deposited metal layer by means of a capping layer. For instance, we have found that a thin (e.g., 6 nm) Y layer, deposited in situ onto a $YBa_2Cu_3$ film, protects the latter against subsequent deterioration if, after deposition of the capping layer, the system is vented to pure oxygen (or, more generally, to a dry oxygen-containing atmosphere) such that an yttrium oxide protective layer is formed prior to exposure to ambient air. Without such a protective layer exposure to air typically causes hydrolysis reactions, which, in addition to oxidation, may lead to roughening and segregation of the metal film. In contrast, yttrium oxide-covered metal films according to the invention typically remain smooth even after a few minutes of exposure to moist air.

Subsequent to the deposition of the stoichiometric oxygen-free metal film, the substrate with the film thereon is subjected to a heat treatment in an oxygen-containing atmosphere such that the appropriate superconductive oxide is formed. For instance, a metal film of overall composition $YBa_2Cu_3$ is transformed into a crystalline oxide film (nominally of Perovskite structure) of nominal composition $YBa_2Cu_3O_7$, which can have $T_c$ to about 95 K., typically >77 K. ($T_c$ herein is the temperature at which the resistance has fallen to 50% of the extrapolated normal state resistance.)

The heat treatment exemplarily is carried out in ambient pressure oxygen, although treatment in higher or lower pressure atmospheres, including mixtures of $O_2$ and other gases (nominally inert gases such as argon, possibly reactive gases such as fluorine) is not excluded. Heat treatment may be conventional, e.g., comprising maintaining the material at a temperature in the range 800°-1000° C. for a period in the range 1 minute to about 10 hours, followed by a relatively slow cool to a temperature of about 400° C. or below. In $YBa_2Cu_3O_7$ films treatment below about 800° C. typically does not result in the desired crystal structure, and heat treatment above about 1000° C. frequently results in undesirable poisoning of the film. (It will be appreciated that films of a different composition may require heat treatment at somewhat different temperatures.) The required heat treatment time is typically a function of the temperature used, with lower temperatures requiring longer times, as is well known to those skilled in the art. A minor amount of experimentation will generally suffice to establish the appropriate length of heat treatment for any given temperature.

Although a conventional heat treatment can be used in the practice of the invention, we have discovered that a heat treatment that comprises both a first firing (at a temperature and for a period selected such that a relatively smooth, fine-grained oxide film results) prior to the final second firing (at a temperature and for a period chosen such that a film of the desired oxygen content, crystal structure, and superconductive properties results) can have significant advantages over prior art heat treatments. In particular, such a multi-step firing is advantageous if the oxide film is being patterned after the first firing but prior to the second firing, since the small-grained film resulting from the first firing typically is more resistant to hydrolysis and other environmentally induced degradation effects than a film that has been completely fired. Furthermore, "first firing" films typically can be patterned with improved definition, as compared to completely heat treated films, due to the smaller grain size in the former.

Although we have typically found it advantageous to choose a first firing temperature that is lower than the second firing temperature (e.g., 800°-850° C. and 850°-1000° C., respectively, for $YBa_2Cu_3O_7$ films), this choice is not a requirement, and in some cases it may be found desirable to choose a second firing temperature that is equal to or even lower than the first temperature. In such a case, typically the treatment time at the second temperature would be relatively long. The functional requirements are that the treatment at the first firing temperature should yield a smooth, relatively fine-grained oxide film (which typically is relatively resistant to degradation), and that the subsequent heat treatment should yield a superconductive oxide film having the desired composition, structure, and superconductive properties.

In some preferred embodiments of the invention, patterned superconductive oxide films are produced by a process that comprises a first firing of the oxygen-free metal film in an oxygen-containing atmosphere, patterning the resulting fine-grained oxide film by any appropriate process, and completing firing the patterned oxide film in an oxygen-containing atmosphere. By way of example, we have fired $YBa_2Cu_3$ films (about 1 μm thickness, deposited on $ZrO_2$ substrates with Nb buffer layer thereon) for about 5 minutes at 800° C. in $O_2$ at ambient pressure, followed by furnace cool-down in $O_2$. The resulting oxide films were substantially smooth, shiny, with a typical grain size of about 0.5 μm or less, and typically were superconductive, albeit with relatively broad transition. After conventional lithographic processing and etching in about 0.01N nitric or acetic acid, the patterned films were heated to a temperature in the range 900°-1000° C. in $O_2$ and typically maintained at that temperature for several minutes, followed by a slow cool in $O_2$. The thus produced patterned oxide films typically had an average grain size of about 3 μm or more, and were superconductive, with sharp transitions, with $T_c$ of about 80 K. As shown in FIG. 1, first temperature firing prior to patterning is optional, and patterning of the metal film prior to heat treatment in an oxygen-containing atmosphere is contemplated.

The inventive heat treatment and patterning procedure is thought to have broad applicability. It can be advantageously combined with essentially any deposition technique useful in forming superconductive oxide films, e.g., sputtering or evaporation from oxide sources, sputtering or evaporation in oxygen-containing atmosphere, and spin-on.

After formation of the superconductive oxide film, processing can be continued in a conventional fashion to produce the desired structure. Such processing typically comprises provision of means for making electrical contact with the superconductive layer, but may also comprise forming further material layers (e.g., a protective coating, or possibly a dielectric or metallic layer) on all or part of the superconductive film, as is well known in the art. Examples of such applications are discussed in the previously referred to U.S. patent application Ser. No. 094,573.

EXAMPLE 1

A superconducting $YBa_2Cu_3O_7$ film was produced on a $ZrO_2$ substrate with an Ag buffer layer thereon. The substrate surface was polished, etched in 1:1 aqueous $HNO_3$, rinsed in deionized water, then ultrasonically cleaned in acetone and methanol, and blown dry with nitrogen. Thereafter, the substrate was placed in a sample holder in a vacuum chamber such that the prepared surface was exposed.

The vacuum chamber included three DC magnetron sputtering sources, one each for Ag, Y, and $Ba_2Cu_3$ alloy, and was equipped with a rotating substrate table. After evacuating the chamber to about $10^{-7}$ Torr (about $1.4 \times 10^{-5}$ Pa), the chamber was backfilled with argon (about $1.5 \times 10^{-2}$ Torr or about 2.1 Pa), the targets were cleaned by pre-sputtering until the voltage and current on the alloy target became stabilized, with closed shutters protecting the sample. A conventional quartz crystal thickness monitor was programmed with the weighted average density of $Ba_2Cu_3$ (4.75 $gm/cm^3$) and the rate of deposition from the $Ba_2Cu_3$ target set at 1.55 nm/sec. By a similar procedure, the rate of Y deposition was set at 0.26 nm/sec, and that for Ag at 1 nm/sec. After turning off both the Y-source and the $Ba_2Cu_3$ source, the substrate table rotation was started (18 rpm), all the shutters were opened, and 100 nm of Ag deposited. Subsequently, the Ag-source was turned off, the shutters closed, and the previously established current and voltage levels on the other two sources re-established. Opening the shutters, with the table rotating at 18 rpm, a 1 $\mu m$ thick film of $YBa_2Cu_3$ was deposited. Under the above conditions the thickest individual layer ($Ba_2Cu_3$) had a thickness less than 1 nm. The constituents of the metal layer were thus intimately mixed. After attainment of the desired film thickness the $Ba_2Cu_3$-source was turned off, while Y deposition was continued for about 48 seconds in order to deposit about 5 nm of Y. After turning off the Y-source the chamber was vented to pure $O_2$ for 10 minutes. This produced a stable yttrium oxide protective layer. After opening the chamber the sample was transferred to a conventional tube furnace. The sample was soaked at 250° C. for 30 minutes, followed by rapid heating to 970° C., maintained at that temperature for 5 minutes and furnace cooled to room temperature (typically about 6 hours). All of the above heat treatment was carried out in flowing $O_2$. The resulting oxide film was superconducting, with a relatively sharp transition, and had a 1-5 $\mu m$ texture.

EXAMPLE 2

The procedure of Example 1 was followed to deposit a capped $YBa_2Cu_3$ film. After transferring the substrate with the metal film thereon to the tube furnace, the sample was heated to about 800° C. in pure $O_2$ and maintained under these conditions for 5 minutes, followed by oven cool-down in $O_2$. The resulting oxide film was black and shiny, had a relatively fine-grained structure (average grain size was less than approximately 0.5 $\mu m$), was stable under normal processing conditions and superconductive (albeit with a relatively broad transition). An approximately 1 $\mu m$ thick layer of a conventional photoresist was then deposited on the oxide film, the resist exposed through a mask in a conventional manner, and developed, also in a conventional manner. The unprotected regions of the film were then removed by immersion of the sample in 0.01N nitric acid, resulting in a patterned film comprising lines about 20 $\mu m$ wide. After stripping off the remaining photoresist, the sample was placed in the tube furnace and heated to 970° C. in pure $O_2$, maintained under those conditions for 5 minutes, and followed by furnace cool under $O_2$ to room temperature. The resulting superconductive film had a 1-5 $\mu m$ texture, a relatively sharp transition, with $T_c$ of about 80 K.

EXAMPLE 3

A patterned superconductive film is produced substantially as in Example 2, except that the layer is formed by a conventional reactive evaporation from three electron beam sources, one each for Y, Ba, and Cu. The resulting film has properties similar to the film of Example 2.

EXAMPLE 4

A patterned superconductive film is formed substantially as described in Example 2, except that the rotation rate of the substrate table is only about 0.9 rpm, resulting in relatively thick layers of Y and $Ba_2Cu_3$ (about 2 and 12 nm, respectively), and except that the metal layer is annealed in $O_2$ for 30 minutes at 800° C. to achieve relative homogeneity. The resulting superconductive oxide film was relatively rough.

EXAMPLE 5

An $YBa_2Cu_3$ layer was deposited substantially as described in Example 1, except that no yttrium oxide capping layer was formed thereon. Exposing the metal layer to the ambient atmosphere results in a pronounced change in appearance (blackening of the previously shiny layer). Heat treatment of the layer as described in Example 1 results in a film of inferior superconductive properties and morphology.

What is claimed is:

1. Method of making a structure including a region comprising a patterned superconductive metal oxide film on a substrate, the method comprising providing the substrate, forming a layer of metal-containing material on the substrate, heat treating the layer in an oxygen-containing atmosphere and patterning the layer.

characterized in that heat treating and patterning comprises
  (a) heat treating the layer in the oxygen-containing atmosphere such that a relatively smooth and fine-grained metal oxide film results;
  (b) patterning the fine-grained film; and
  (c) heat treating the patterned fine-grained film in the oxygen-containing atmosphere such that the patterned superconductive metal oxide film results.

2. Method of making an article comprising a superconductive metal oxide film on a substrate, the superconductive film having nominal composition $Ba_{2-y}(M_{1-x}M'_x)_{1+y}Cu_3O_{9-\delta}$, where M and the optional M' are selected from the group consisting of Y, Eu, Nd, Sm, Gd, Dy, Ho, Er, Tm, Yb, Lu, La, Sc, Sr, and combinations thereof, with $0 \leq x \leq 1$, $0 \leq y \leq 1$, and $1 < \delta < 3$; the method comprising
  (a) providing the substrate;
  (b) depositing on the substrate a multi-constituent metal layer that is substantially free of reactive non-metallic constituents and contains Ba, M, the optional M', and Cu in substantially the same ratio as the desired superconductive metal oxide film; and (c) heat treating the metal layer in an oxygen-containing atmosphere such that the metal layer is transformed into the superconductive metal oxide film;

characterized in that the multiconstituent metal layer comprises Y, and the method further comprises (i) depositing a layer of yttrium onto the multiconstituent metal layer and contacting the layer of yttrium with a dry oxygen-containing atmosphere, whereby a protective layer is formed such that deterioration of the multiconstituent metal layer due to interaction with the ambient atmosphere is at least substantially reduced;

(ii) heat treating the multiconstituent metal layer in the or a oxygen-containing atmosphere at a temperature in the range 800°–850° C. for a time sufficient to result in formation of a relatively smooth fine-grained oxide film;

(iii) patterning the fine-grained oxide film; and (iv) heat treating the patterned fine-grained oxide film in the or a oxygen-containing atmosphere at a temperature in the range of 900°–1000° C. for a time sufficient to result in formation of the superconductive oxide film.

* * * * *